United States Patent
Chang

(10) Patent No.: US 10,262,836 B2
(45) Date of Patent: Apr. 16, 2019

(54) ENERGY-EFFICIENT PLASMA PROCESSES OF GENERATING FREE CHARGES, OZONE, AND LIGHT

(71) Applicant: Seongsik Chang, Santa Clara, CA (US)

(72) Inventor: Seongsik Chang, Santa Clara, CA (US)

( * ) Notice: Subject to any disclaimer, the term of this patent is extended or adjusted under 35 U.S.C. 154(b) by 0 days.

(21) Appl. No.: 15/962,850

(22) Filed: Apr. 25, 2018

(65) Prior Publication Data
US 2018/0315582 A1   Nov. 1, 2018

Related U.S. Application Data

(60) Provisional application No. 62/492,103, filed on Apr. 28, 2017, provisional application No. 62/525,749,
(Continued)

(51) Int. Cl.
*C02F 1/78* (2006.01)
*C01B 13/10* (2006.01)
*H01J 37/32* (2006.01)

(52) U.S. Cl.
CPC ........ *H01J 37/32348* (2013.01); *C01B 13/10* (2013.01); *C02F 1/78* (2013.01); *H01J 37/32871* (2013.01); *C02F 2201/782* (2013.01); *C02F 2303/04* (2013.01); *H01J 2237/022* (2013.01)

(58) Field of Classification Search
CPC .......... H01J 37/32348; H01J 37/32871; C01B 13/10; C02F 1/78
See application file for complete search history.

(56) References Cited

U.S. PATENT DOCUMENTS

| | | | | |
|---|---|---|---|---|
| 5,004,587 A | * | 4/1991 | Tacchi | C01B 13/11 422/186.07 |
| 5,089,098 A | * | 2/1992 | Tacchi | C01B 13/11 204/176 |

(Continued)

FOREIGN PATENT DOCUMENTS

| | | |
|---|---|---|
| JP | 2002216704 A | 8/2002 |
| JP | 2005267908 A | 9/2005 |

OTHER PUBLICATIONS

PCT/US2018/029589, Written Opinion of the International Searching Authority, (4 pages).

*Primary Examiner* — Dedei K Hammond
*Assistant Examiner* — Raymond R Chai
(74) *Attorney, Agent, or Firm* — Womble Bond Dickinson (US) LLP

(57) ABSTRACT

Embodiments of the present invention describe the formation of a current source, a light source, and an ozone generator by using a coated double dielectric barrier discharge system (CDDBD). A system for generating charge may include a CDDBD having at least two electrodes that are separated by a gap filled with a gas medium, wherein each of the at least two electrodes are covered with an insulator that prevents charges in the at least two electrodes from passing through the gas medium, and wherein surfaces of each of the at least two insulators are coated with a material having a secondary electron emission coefficient higher than a material of the insulator. Furthermore, the system for generating the charge may also include a power supply coupled with the CDDBD device that supplies energy to the CDDBD device to form an initial electric field.

14 Claims, 12 Drawing Sheets

Related U.S. Application Data filed on Jun. 28, 2017, provisional application No. 62/554,552, filed on Sep. 5, 2017, provisional application No. 62/575,503, filed on Oct. 22, 2017.

(56) References Cited

U.S. PATENT DOCUMENTS

| | | |
|---|---|---|
| 2005/0199484 A1 | 9/2005 | Franek |
| 2006/0176045 A1 | 8/2006 | Dosaka |
| 2008/0169763 A1* | 7/2008 | Burke ............... B03C 3/383 315/111.21 |
| 2011/0102961 A1* | 5/2011 | Lane ............... H05F 7/00 361/212 |
| 2016/0220670 A1* | 8/2016 | Kalghatgi ............ A61K 41/00 |
| 2016/0307649 A1* | 10/2016 | Yazdanbod ............ G21B 3/006 |
| 2017/0232132 A1* | 8/2017 | Deane ............... A61L 9/22 422/121 |

* cited by examiner

ENERGY-EFFICIENT PLASMA PROCESSES OF GENERATING FREE CHARGES, OZONE, AND LIGHT

RELATED APPLICATIONS

This application claims priority to and the benefit of U.S. Provisional Patent Application No. 62/492,103, filed on Apr. 28, 2017, U.S. Provisional Patent Application No. 62/525,749, filed on Jun. 28, 2017, U.S. Provisional Patent Application No. 62/554,552, filed on Sep. 5, 2017, and U.S. Provisional Patent Application No. 62/575,503, filed on Oct. 22, 2017. The disclosures of the above applications are incorporated by reference herein in their entirety.

FIELD

Embodiments of the present invention relate generally to the field of current, ozone, and light generation.

BACKGROUND

Earth is under threat of global warming and resulting climate change is threatening the population with frequent or massive storms, wild fires, submerging of lands under water, and melting of useful water sources. Global warming is believed to be caused by carbon dioxide ($CO_2$) emission from fossil fuel burning with which more than 60% of world's energy is produced. New sources of non-$CO_2$-emissive energy, green energy, or renewable energy is constantly being pursued in order to protect the environment. Wind energy, hydro energy, and nuclear energy are examples of renewable energy sources that are being pursued.

Water shortage is also a challenging problem, not only due to global warming, but also due to dry weather in certain regions, such as California or Africa. Efficient recycling of used or polluted water will help to solve problems of shortage of water. Chemical treatment of used or polluted water, however, has been known to cause skin irritation, for example when used in swimming pools. Furthermore, such treated water often has an unpleasant odor, for example when used for drinking water. Ozone water treatment has been known as a superior water treatment process but suffers from a high energy cost of ozone production.

Luminous efficiency of lightning systems has increased, from 2% for light bulbs to 20% for fluorescent lamps or light emitting diodes (LEDs). Recent development and cost reduction of LED technology has replaced conventional light bulbs or fluorescent lamps. However, still higher energy efficiency is sought. Furthermore, LEDs are currently manufactured with a toxic chemical epitaxy growth process that is not desirable. The small size of LED is also not suitable for broad area lighting that can give the same total light output with a weak broad area emission. This broad area emission is particularly useful for preventing unintentional blinding in the eyes of people during intense small area emission.

BRIEF DESCRIPTION OF THE DRAWINGS

The present disclosure will be understood more fully from the detailed description given below and from the accompanying drawings of various embodiments, which, however, should not be taken to limit the embodiments described and illustrated herein, but are for explanation and understanding only.

DETAILED DESCRIPTION

Figure 1:
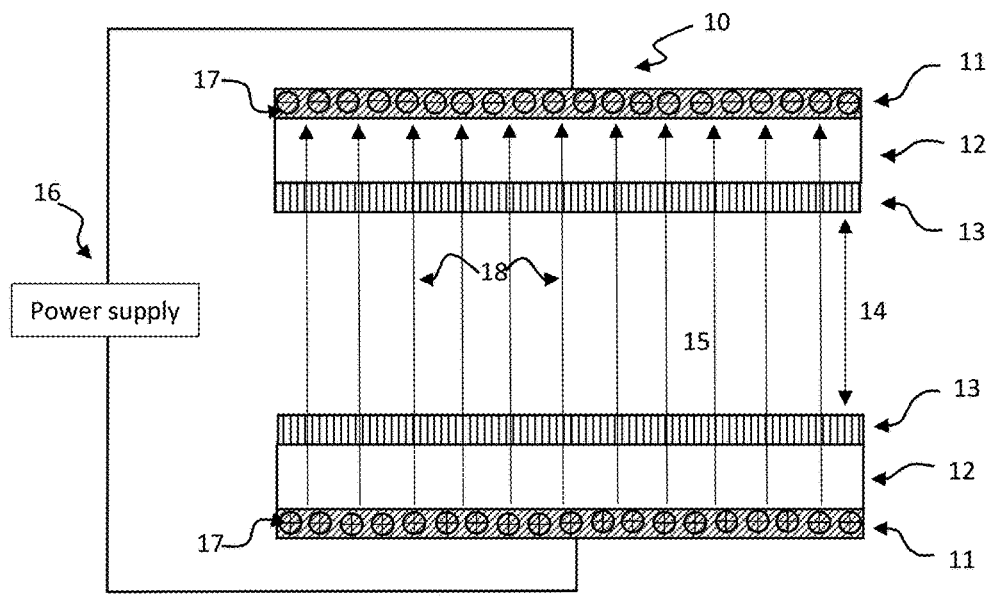
FIG. 1 illustrates one embodiment of coated double dielectric barrier discharge (CDDBD) systems with DC power supply.

In the following description, numerous details are set forth. It will be apparent, however, to one of ordinary skill in the art having the benefit of this disclosure, that the embodiments described herein may be practiced without these specific details. In some instances, well-known structures and devices are shown in block diagram form, rather than in detail, in order to avoid obscuring the embodiments described herein.

An ideal capacitor is a reactive component of an electrical circuit that does not consume energy. A capacitor having two electrodes can be made with each electrode covered or buried with an insulator and spaced apart in a gas system. If alternating current (AC) voltage is applied to the capacitor, there is no power consumption other than unwanted loss in the power supply. If an AC voltage applied is higher than a Paschen threshold, plasma is formed in the gap, but it is still electrically a capacitor with higher capacitance. Since there are no charges passed through the insulator covering the electrodes, no power is consumed. The resulting products of plasma action are airborne charges, light emission, and radical formation. These byproducts can be used to make systems such as a current source, an energy efficient light emitter, and an energy efficient ozone generator, as discussed in greater detail herein.

Embodiments of the present invention describe the formation of a current source, a light source, and an ozone generator by using a coated double dielectric barrier discharge system (CDDBD). In the embodiments, the CDDBD system is an electrical capacitor with an insulator covering electrodes and a gas system in between. With a non-dissipating insulator, such a system does not consume AC power, other than unwanted power losses in the power supply. With AC voltage amplitude higher than a Paschen breakdown voltage, airborne charges and light emission occurs without additional power consumption, but as a result of converting electric field energy. With a highly efficient power supply or electricity generator, net energy generation can be positive, where net energy consists of free charges and/or light emission.

From a physics point of view, cosmic rays trigger ionization of gas and charge multiplication occurs under a high electric field. This is how plasma is formed. Cosmic rays are high-energy (in the range of billion electron volts) radiation, mainly originating outside of the solar system, and even from distant galaxies. Cosmic rays are composed of primarily protons, atomic nuclei, and energetic solitary electrons. Cosmic rays are given from the Universe, that is free, but subsequent charge multiplication processes involve conversion of electric field energy to ionization and light emission.

In embodiments discussed herein, charges generated in a discharge system can be freed via an electrode geometry discussed herein, in order to achieve a continuous current source. In one embodiment, wind energy can be effectively used to enhance liberation of charges from the discharge system, and therefore such a system becomes a wind energy to electric energy converter. In another embodiment, radicals produced within plasma makes the system an energy efficient ozone generator with oxygen injection. In yet another embodiment, light emission from this system can be used as energy efficient lighting system. The embodiments of the present invention, as discussed herein, may be applied into many fields, for example, electric power generators, light generators, and ozone generators.

Embodiments of the present invention, as described in greater detail below, will describe embodiments of power generators, light generators, and ozone generators. As a power generator, for example, embodiments of the present invention can be used for a power supply, battery charger, current source, and wind energy harvester if used in conjunction with converting wind energy. As a light generator, for example, embodiments of the present invention can be used as an energy-efficient or low-cost fluorescent lamp. As an ozone generator, for example, embodiments of the present invention are related to an energy-efficient ozone generator that can be used as an effective pathogen killer that has useful applications in water treatment, food processing, and fabric processing.

Coated Dielectric Barrier Discharge System

The operating principle and a first embodiment of the present invention will be described with reference to FIGS. 1 to 5. FIG. 1 shows a coated double dielectric barrier discharge (CDDBD) system 10, where electrodes 11 covered with an insulator 12 on which a special coating 13 is applied, are separated with a gap 14 within a gas 15. A power supply 16 is coupled to the CDDBD system. CDDBD system 10 is electrically a capacitor with two insulating materials, an insulator 12 and a gas 15 in the gap. When a voltage is applied by the power supply 16, charges 17 move toward electrodes and establish an electric field 18. As long as the insulator 12 has very high electrical resistivity, there is no charge dissipation and no power consumption.

Figure 2:
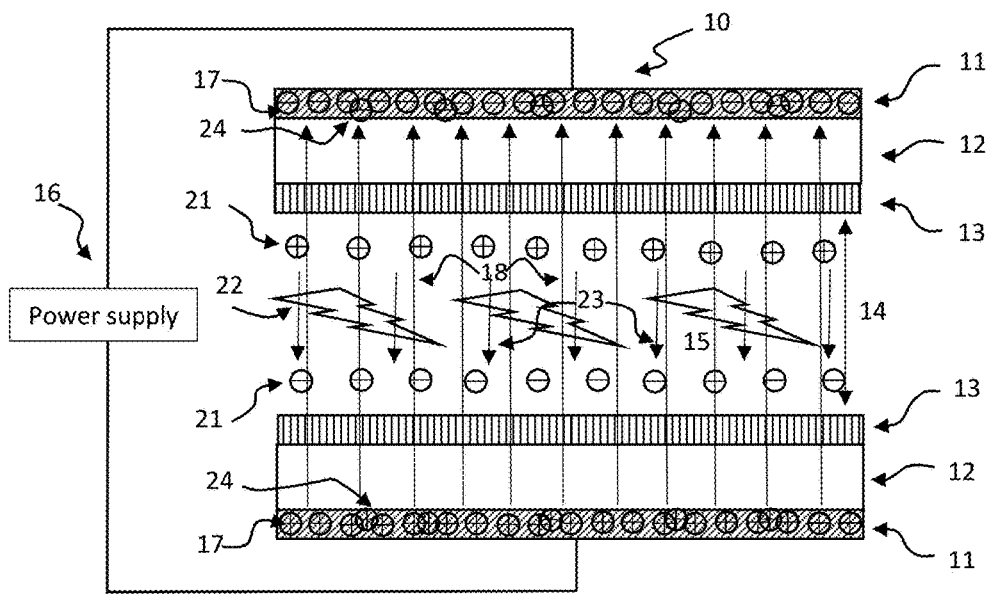
FIG. 2 illustrates the CDDBD system in FIG. 1 at above Paschen discharge threshold that results in charge generation and light emission.

If the voltage across air is above Paschen threshold, air breakdown occurs. Paschen breakdown results in charge generations 21 as well as light emissions 22 as shown in FIG. 2. Charges generated in this process travel to electrode with opposite sign and form an electric field 23 that opposes initial electric field 18 and therefore, more charges 24 are flown into the electrodes in order to satisfy voltage boundary condition at the electrode. However, still no charges pass through the capacitor and no power is consumed. Charges and light generated are not created, but converted from original electric field 18 energy, and therefore, satisfy conservation of energy. In the view point of electric circuit, the value of capacitance has changed, and therefore, more charges were sent to the electrodes to satisfy $V=Q/C=Q'/C'$, where C is capacitance before breakdown and C' is capacitance after breakdown.

In embodiments, the material for the insulator 12 used in CDDBD is highly electrically resistive so that charges from the electrodes 11 do not leak through to the gas medium. The Insulator material 12 also has high dielectric strength so that the material does not electrically breakdown under the electric field being used in CDDBD system. For example, the material for the insulator 12 can have the electrical resistivity higher than $10^{17}$ Ω·cm and the dielectric strength higher than 15 MV/m, such as quartz, porcelain, glass, polyimide, Teflon, or Polyethylene terephthalate (PET).

The gas medium 15 described in the CDDBD system can be air, which comprises nitrogen and air at one atmospheric pressure. The CDDBD system can also be constructed as an enclosed system where gas medium 15 is an inert gas system such as argon or helium at lower than one atmospheric pressure.

Figure 3:
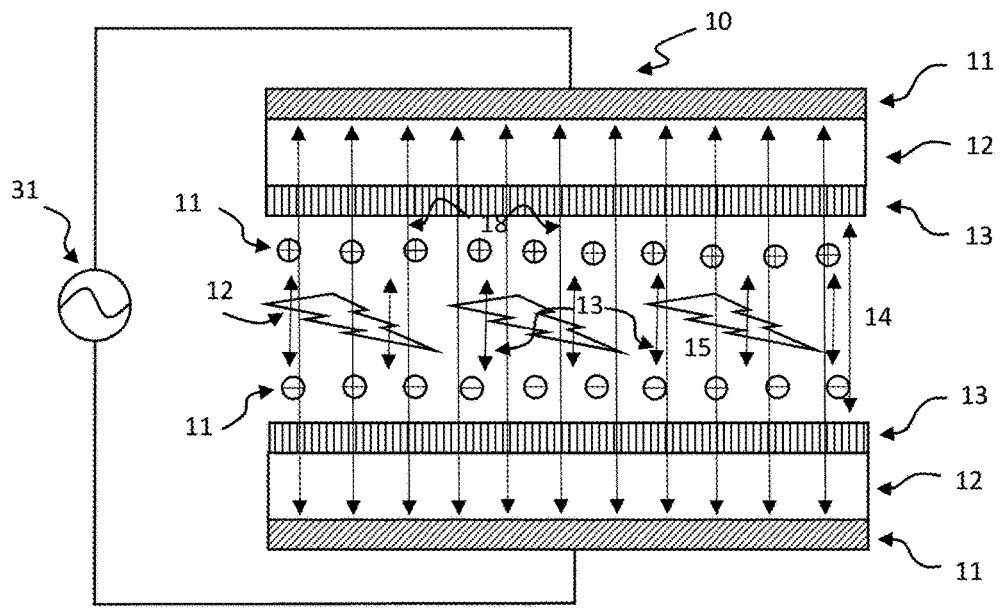
FIG. 3 illustrates the CDDBD system with AC power supply at above Paschen discharge threshold that results in repeated charge generation and light emission.

If AC voltage 31 is applied as shown in FIG. 3, continuous operation of charge generation 21 and light emission 22 occur. As polarity changes, Paschen threshold changes due to residual charges and the position of newly generated charges flips. However, in each cycle new generation of charges 21 and light emission 22 occur. Still, in electrical circuit point of view, it is the capacitance circuit and there is no power consumption at CDDBD system. Charge generation and light emission can be enhanced if a proper coating 13 is applied on the insulator. The coating is material that has a high secondary electron emission coefficient such as alkali antimonide, beryllium oxide (BeO), magnesium oxide (MgO), gallium phosphide (GaP), gallium arsenide phosphide (GaAsP), lead oxide (PbO), tungsten (W), or molybdenum (Mo). The coating material also can be a cathode material that is used for photomultiplier where one electron impact produces many electrons. Then, net energy generated in this AC driven CDDBD system will be total energy of generated charges and light emission minus losses that occur in the power supply system. Here, plasma is limited to a cold plasma where there is no joule heating in the plasma region. The intensity of the plasma can also be controlled by conductivity of electrode 11 materials. Streamers are high intensity filamentary discharge that usually occurs in the atmospheric pressure plasma system. Streamers occur because of positive feedback of electric field enhancement from the free charges at the electrode 11. Streamer intensity can be controlled by controlling free charge density at the electrode 11. For example, by using semiconductor material with electrical resistivity ~$10^6$ Ω·cm, free charges are reduced by 10 orders of magnitude compared to typical metals with electrical resistivity ~$10^{-6}$ Ω·cm.

Figure 4:
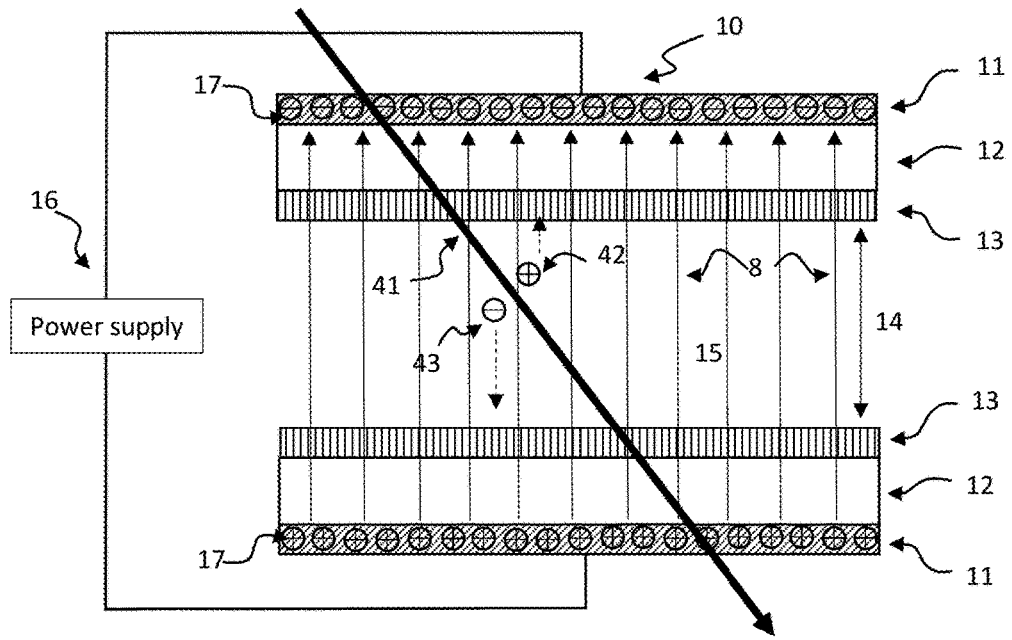
FIG. 4 illustrates the CDDBD system in FIG. 1 when a cosmic ray ionizes a gas molecule within CDDBD system.

In embodiments discussed herein, the plasma processes described in the embodiments of the present invention are harvesting energy of cosmic rays and then converting electric field energy into free charges and light. Unlike conventional systems, plasma is ignited by cosmic rays 41 as shown in FIG. 4. Typical ionization energy of air molecule is on the order of 10-20 eV, for example, 15 eV for nitrogen molecule. Ionization cannot be achieved by applying a typical electric field alone from high voltage power supply. 90% of cosmic rays 41 have energy of GeV and 90% of them are proton. Therefore, cosmic rays 41 have high enough energy to ionize gas molecules. GeV cosmic rays 41 ionize one or two gas molecules on the way and keep going. So, initial 15 eV of energy is free from the Universe.

Figure 5:
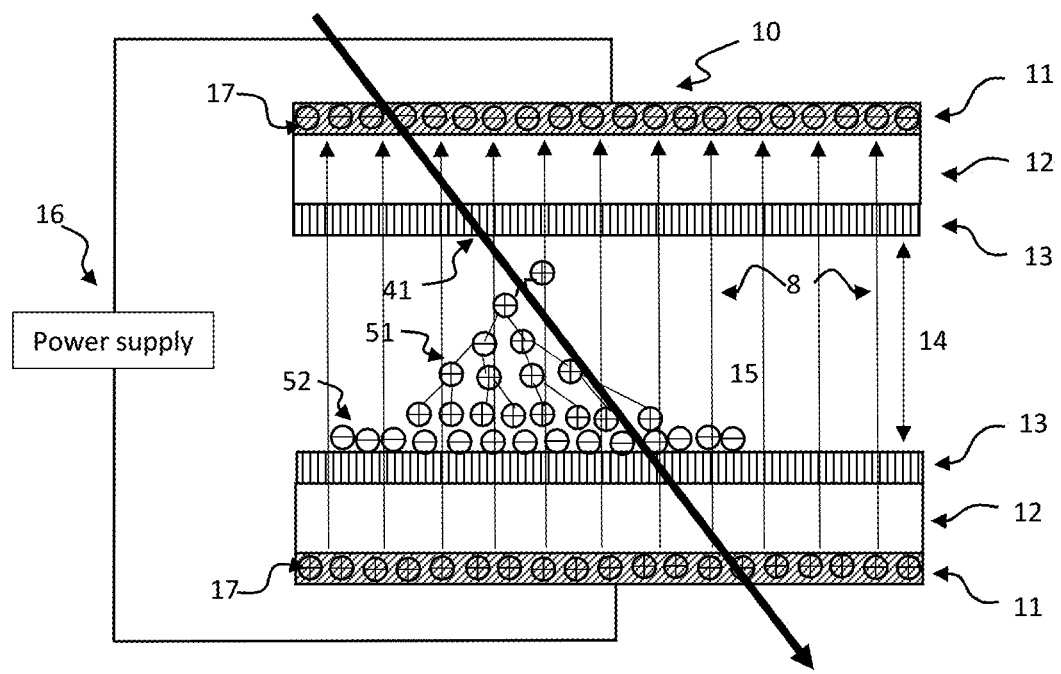
FIG. 5 illustrates the CDDBD system in FIG. 1 at a stage where charge multiplication occurs within CDDBD system.
Figure 6A:
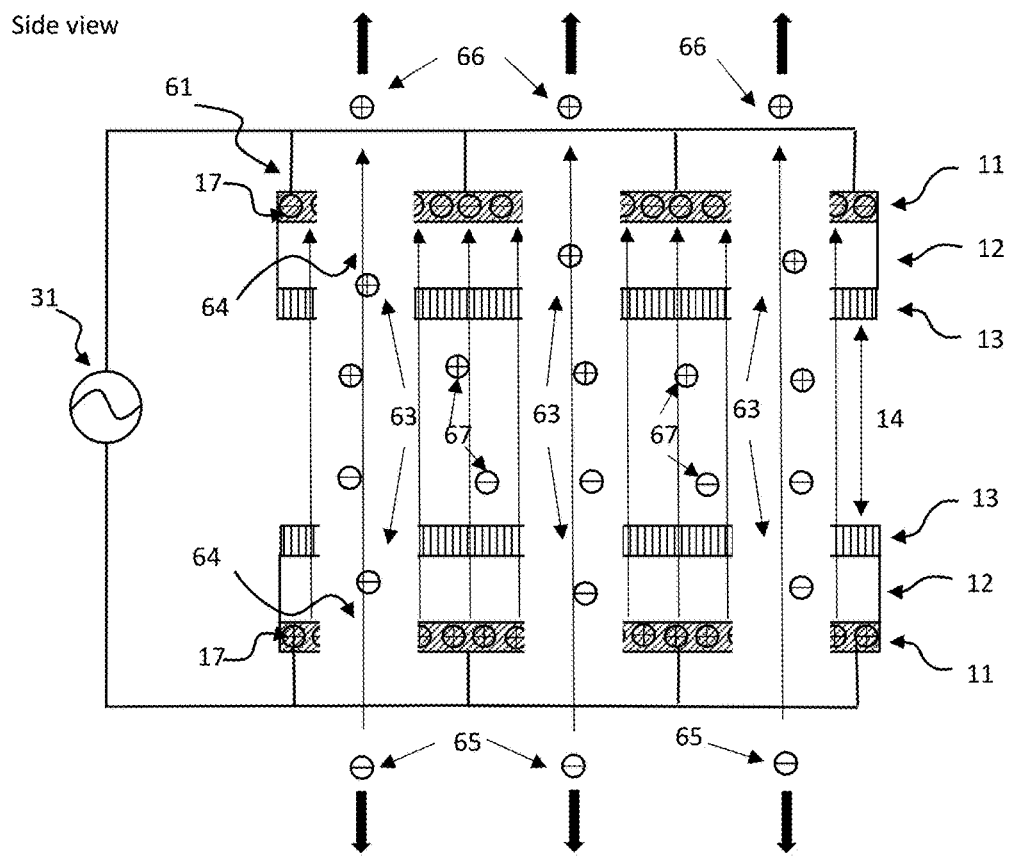
FIG. 6A illustrates a side view of one embodiment of current sources comprising of a planar CDDBD system with holes.
Figure 6B:
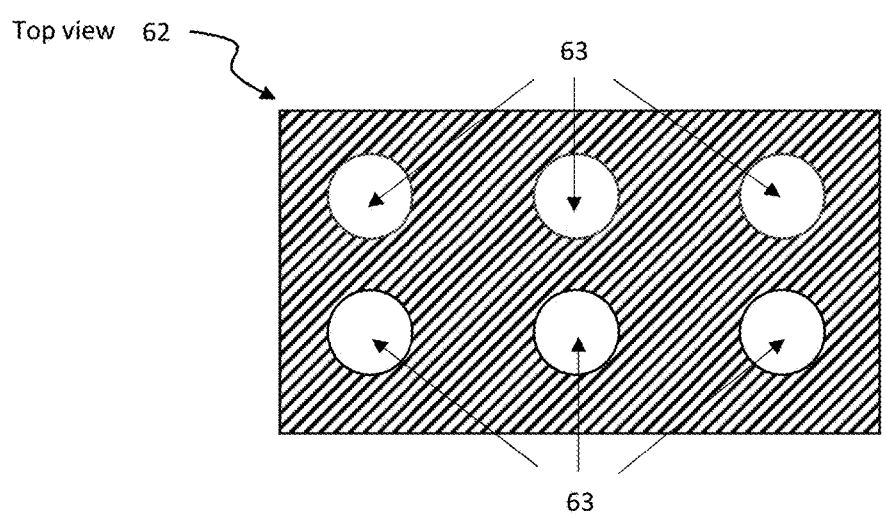
FIG. 6B illustrates a top view of one embodiment of current sources comprising of a planar CDDBD system with holes.

FIG. 4 describes a cosmic ray ionization process. If cosmic ray induced ionization occurred where there is no electric field, positive ions 42 and electrons 43 don't have much kinetic energy and even they will recombine. However, if ionization occurred within an electric field, positive ions 42 and electrons 43 will be swept across into opposite direction. At this point, this electron and positive ion has potential energy according to configuration. The combined potential energy is eE·g, where e is electric charge, E is electric field, and g is a gap 14. For example, let's say in the plasma region, electric field is 9V/um and the gap is 100 um. If ionization occurred near the negative electrode, electron will accelerate into positive electrode. The potential energy of this electron is e·E·g=e·(9V/um)·(100 um)=900 eV. If ionization occurred at the center of plasma region, electron has 450 eV in potential energy and positive ion has 450 eV. If ionization occurred near the positive electrode, positive ion has 900 eV and electron has no potential energy. On average, or by statistics, average electron potential energy in this plasma region will be 450 eV. If there were no air molecules around, electron will gain its speed and 450 eV potential energy will be converted into kinetic energy. When gas molecules are around, electron will collide with air molecules and if the kinetic energy is high enough, it will ionize another air molecule and so on. This is impact ionization process or avalanche process as shown in FIG. 5. Since nitrogen ionization energy is 15 eV, 450 eV potential energy can produce 30 free electrons 52 and positive ions 51 through impact ionization process. Therefore, at this point we gained 30 free electrons 52 and positive ions 51 and lights from ionization process from a cosmic ray and electric field, where field energy is reduced by the exact amount that corresponds to 29 electrons and positive ions and light emission.

Removal of charges, positive ions 51 and electrons 52 will restore original electric field energy and the process continues. Removal of charges can be made possible with effective electrode geometry as well as wind energy that will be described in the next sections. A CDDBD system with charges continuously freed is a current source and therefore such system is an electric power generator.

Current Source from Coated Double Dielectric Barrier Discharge (CDDBD) System

A second, a third, a fourth, and a fifth embodiment of the present invention described in FIGS. 6-9 are versions of CDDBD system, configured so that airborne charges can escape the CDDBD system. Freed charges can be captured and used to directly drive electronic devices or be stored in electricity storage systems such as batteries. FIGS. 6A & 6B illustrate an embodiment of a variation of an embodiment described in FIGS. 1-5, specifically designed for charge escape. Holes 63 are made on each electrode/insulator/coating assembly. FIG. 6A is a side view 61 and FIG. 6B is a top view 62 of this embodiment. Electric fields 64 extend out of each electrode assembly and therefore, electrons 65 and positive ions 66 can escape out of the CDDBD system. Escaped charges can be collected to drive electronic devices or to be stored at electricity storage devices such as batteries. If charges are all cleared out, original electric field in FIG. 1 is restored without any use of charges from the power supply, and therefore without using any energy. Therefore, sustainable charge supply, that is, current supply is possible. However, some charges 67 in FIG. 6A will not be able to escape because they are not near holes 63. The embodiment described in FIGS. 6A & 6B may not be the most efficient current source but is mentioned here for explanation of principle without deviating much from earlier embodiments described in FIGS. 1-5.

Figure 7A:
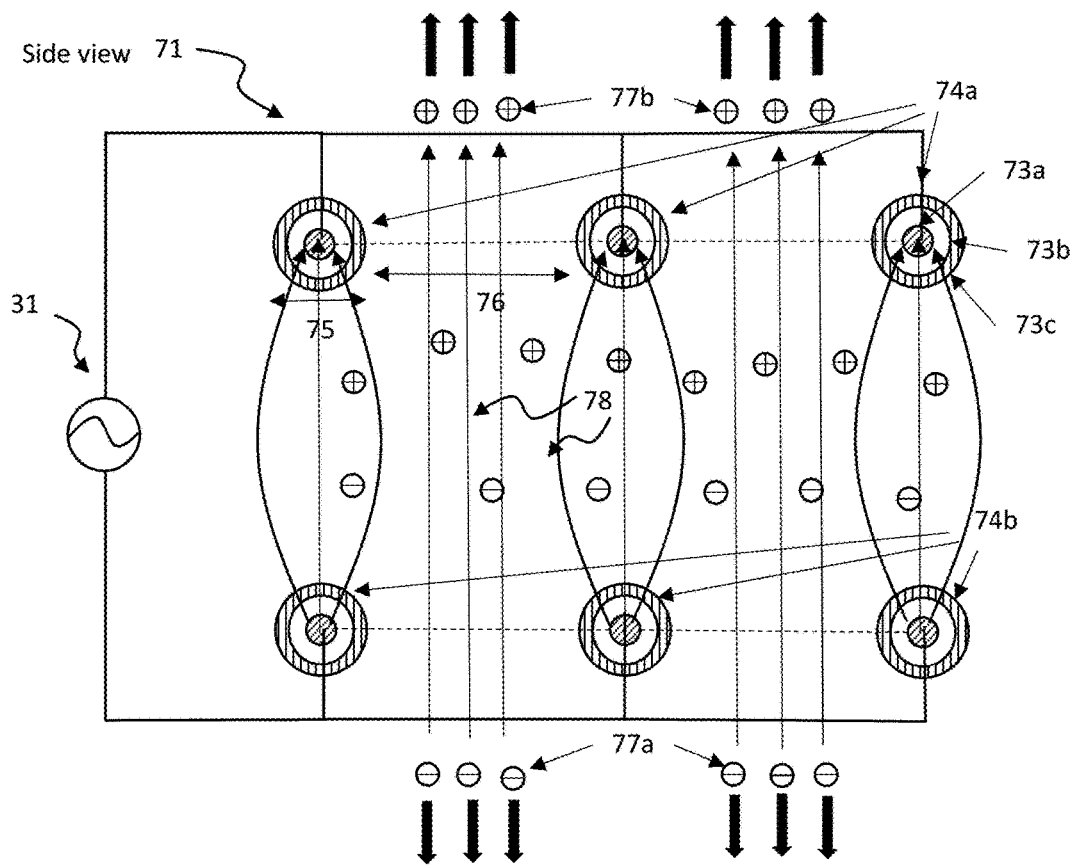
FIG. 7A illustrates a side view of another embodiment of current sources of CDDBD system comprising wire arrays.
Figure 7B:
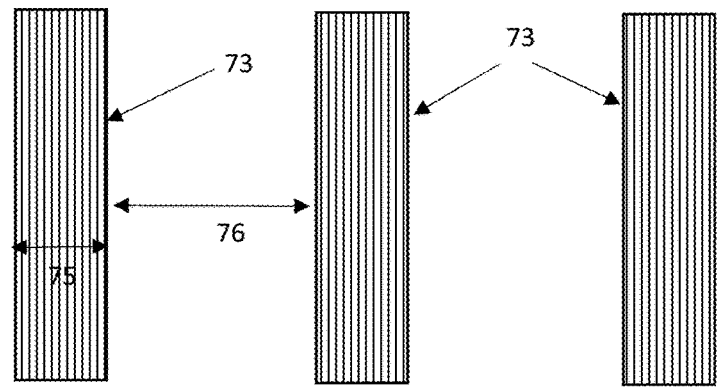
FIG. 7B illustrates a top view of another embodiment of current sources of CDDBD system comprising wire arrays.

A third embodiment of the present invention described in FIGS. 7A and 7B is another version of a current source. FIG. 7A is the side view 71 and FIG. 7B is top view 72 of this embodiment. Electrode/insulator/coating assembly is made in the shape of wire 73, where the most inner part is an electrode 73a, the middle part is an insulator 73b, and the outer part is a coating 73c with high secondary electron emission coefficient. The top and bottom electrode area is made of an array of wires 74a 74b and an electric field 78 is formed between these two arrays of wires 74a 74b. The electric field 78 extends out of the wire arrays 74a, 74b and charges 77a 77b generated between top array 74a and bottom array 74b of wire can escape through the spacing between wires. The space between the wires 76 is significantly larger than wire diameter 75, and therefore escape efficiency is greater than embodiment in FIG. 6 with planar electrodes 11 12 13 with holes 63. The present embodiment is a current source or current generator that is optimized from CDDBD system where no power is consumed from the power supply other than unwanted losses in the power supply. Therefore, net output power is free charges minus unwanted power supply losses.

Figure 8B:
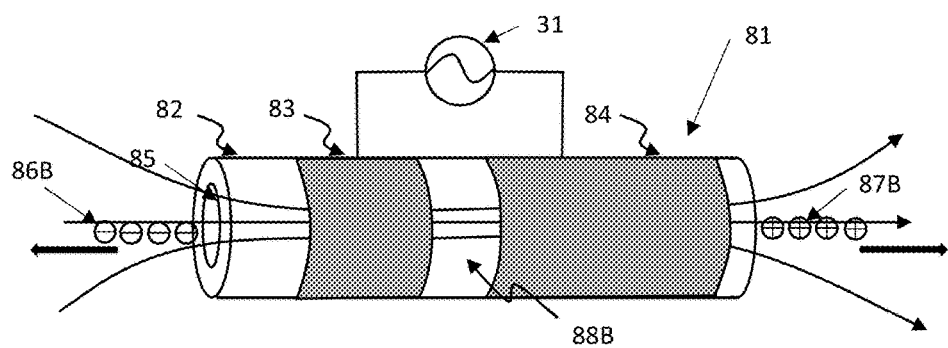
FIG. 8B illustrates FIG. 8A at an opposite polarity of the power supply.
Figure 8A:
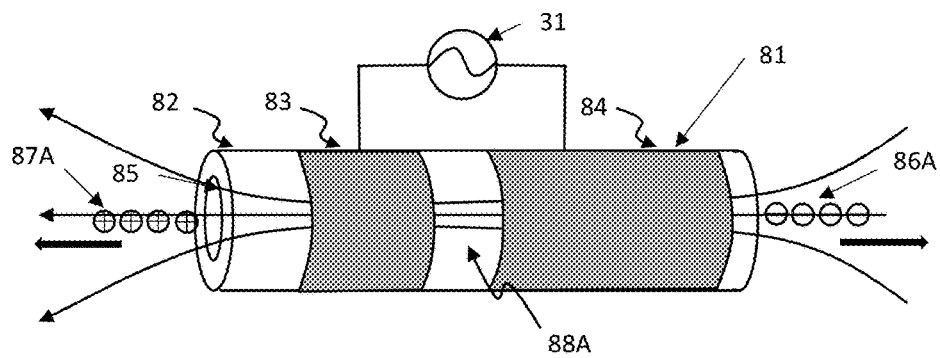
FIG. 8A illustrates another embodiment of current sources of CDDBD system, plasma tubular jet, comprising insulating tube with outer tubular electrodes.

A fourth embodiment of the present invention described in FIGS. 8A & 8B is another version of CDDBD system optimized as a current source, that is optimized so that charges can easily escape from the CDDBD system. An embodiment described in FIGS. 8A & 8B is a plasma tube jet 81, which consists of an electrically insulating tube 82 whose inner surface 85 is coated with high secondary electron emission coefficient material and two tubular electrodes 83 84 are constructed at outer diameter of the tube. Electrically insulating tube 82 can be made of one of, for example, quartz, porcelain, glass, polyimide, Teflon, or Polyethylene terephthalate (PET). Plasma or charge multiplication is formed inside the tube with the same principle as described in the section of the first embodiment of the CDDBD system. Charges that were brought to the tubular electrodes 83 84 from power supply never pass through the insulating tube, and therefore no power is consumed from the power supply other than unwanted losses within the power supply. Electric field 88A, 88B within the tube is extended over the length of the tubular electrode, and therefore charges gain significant amount of kinetic energy along the axial axis and can escape from the tube 86 87. Speed of charges can reach as high as 1 km/sec for positive ions and 200 km/sec for electrons. Escaping charges 86 87 can be collected at an electrode outside of the plasma tube jet 81, that can directly be used as a current source of an instrument or be stored at an electricity storage. FIGS. 8A & 8B illustrates this embodiment with an AC power supply. FIG. 8A illustrates specifically when the right electrode 84 is at more positive voltage than the left electrode 83. The electric field 88A in FIG. 8A is therefore toward left direction and positive ions 87A escape from the opening on the left and electrons 86A escape from the opening on the right. FIG. 8B illustrates specifically when the right electrode 84 is at more negative voltage than the left electrode 83. The electric field 88B in FIG. 8B is therefore toward right direction and positive ions 87B escape from the opening on the right and electrons 86B escape from the opening on the left.

Figure 9:
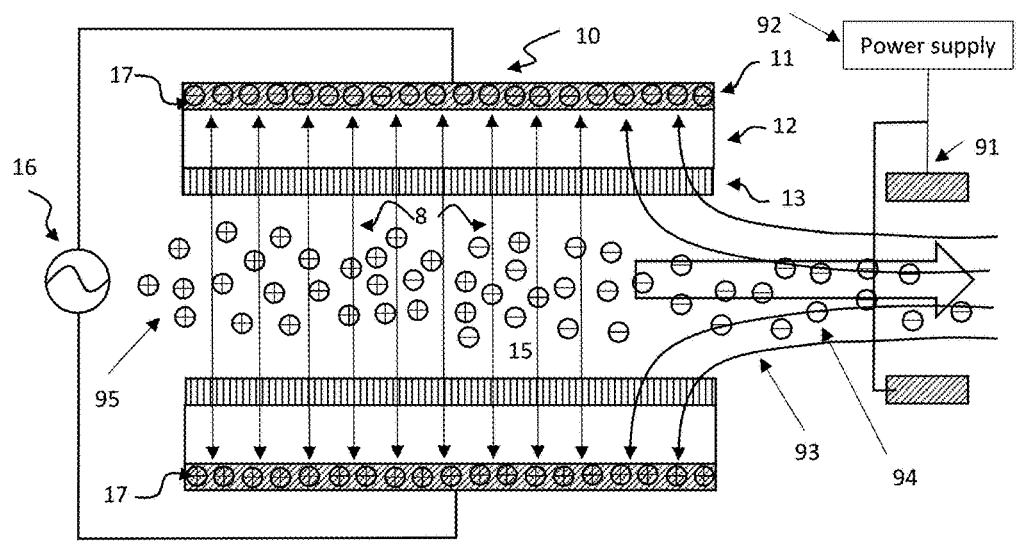
FIG. 9 illustrates one embodiment of current sources using CDDBD system, where charges are extracted with electric field established by a third electrode.

A fifth embodiment of the present invention that can be utilized as a current source is illustrated in FIG. 9. An embodiment described in FIG. 9 is an ion jet, where charges 94, 95 within the plasma region 15 are extracted out by electric field 93 established by a third electrode 91. Next to an CDDBD system 10 that is operated with AC power supply 16, additional electrode 91 is placed with a gap and the electrode 91 is biased by another DC power supply 92 so that it has a fixed voltage difference between the third electrode 91 and average voltage of the first two electrodes 17. If there is enough potential difference between the third electrode 91 and the average voltage of the first two electrodes 17, charges 94, 95 are extracted out from the plasma region 15 of the CDDBD system toward the third electrode by Coulomb forces. FIG. 9 describes an ion jet with a planar CDDBD system 10, but any CDDBD system, for example, described in FIGS. 6-8 can be used instead as long as they are placed next to a third electrode effectively to form a strong electric field to extract charges.

Figure 10:
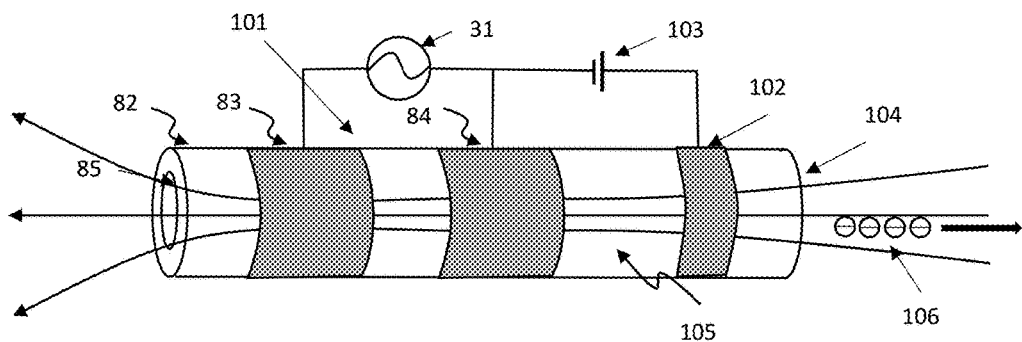
FIG. 10 illustrates plasma tube jet with a third electrode for more efficient charge extraction using electric field.

A sixth embodiment of the present invention that can be utilized as a current source is illustrated in FIG. 10. An embodiment described in FIG. 10 is another embodiment that extracts out charges within the CDDBD system with the help of electric field with an additional electrode at different potential, but in the frame of plasma tube jet 81 described in FIGS. 8A and 8B. In a new plasma tube jet 101 described in FIG. 10, a third electrode 102 is constructed in the same way as the first two electrodes 83 84, but between electrode 84 and the end of the tube 104 where charge is expelled out. The third electrode 102 is connected to a DC offset power supply 103 whose voltage is constant relative to and different from that of the second electrode 84, which is usually described as having a DC offset. For example, in FIG. 10, the polarity of the offset power supply 103 is set such that the third electrode voltage is more positive than the second electrode 84. The electric field 105 between the second 84 and the third electrode 102 applies Coulomb forces on electrons and further extracts electrons 106 from the plasma that was established between the first electrode 83 and the second electrode 84. With the third electrode 102, electric field 105 can be further more straightened compared to that 88A 88B of the tube jet without the third electrode in FIGS. 8A and 8B, and therefore, the charge extraction efficiency increases. Because the polarity of the DC offset power supply 103 is fixed, plasma tube jet 101 described in FIG. 10 prefers one charge to the other. For example, in FIG. 10, the preferred charge is electron 106. The electric field 105 between the second electrode 84 and the third electrode 102 is not higher than Paschen threshold, and therefore no new charges are generated in this region. The electric field 105 is only used for efficient charge extraction.

Wind Energy Harvester

CDDBD systems can be used as wind energy harvesters. Embodiments of the present invention described in FIGS. 6-10 have electrode designs specially for easy charge escape. Charge escape is possible with special electrode designs such that electric field extends out of the main plasma region with holes or tubes for charges to escape. However, the efficiency may not be high due to obstructing elements where charges can stick to. The charge extraction efficiency can be increased by blowing charges with air flow or wind. Positive ions and electrons are airborne and move with the air flow. Therefore, wind or airflow can help to move charges out of the CDDBD system so that they are free to be used as an electric energy source. In this process, wind frees charges that are bound to the CDDBD electric potential. As much as charges gain electric potential energy to be free from the CDDBD binding potential, wind loses its kinetic energy according to the law of energy conservation. Therefore, this embodiment that is utilized of a CDDBD system is referred to as wind energy harvester.

Figure 11:
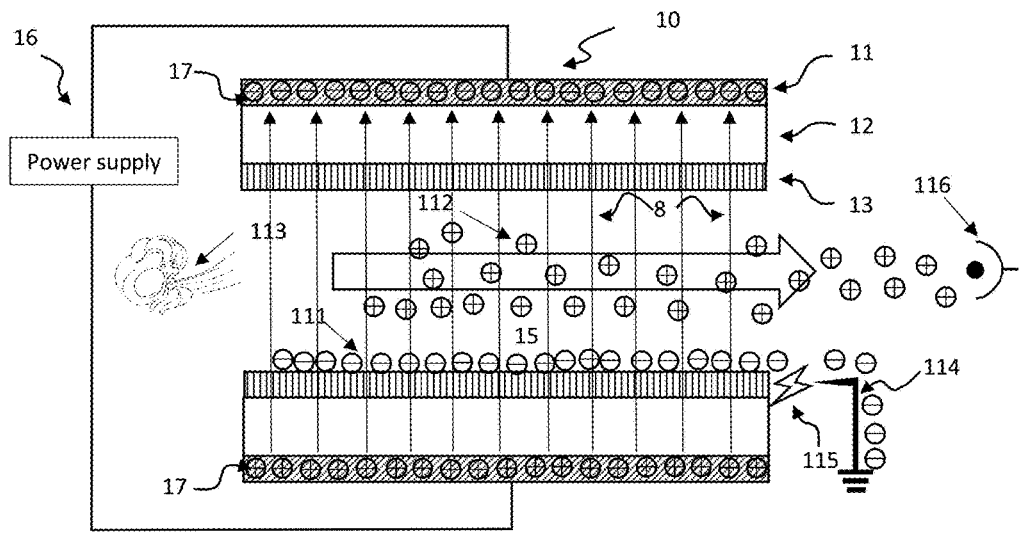
FIG. 11 illustrates one embodiment of a wind energy harvester using a planar CDDBD system described in FIG. 1.

An embodiment of the present invention configured for wind energy harvesting using CDDBD system is illustrated in FIG. 11. In this embodiment, positive ions 112 are blown away 113 from CDDBD system 10 and collected in the downstream 116. This is because positive ions 112 stay in the air longer than electrons 111. In an atmospheric discharge system, impact ionization gain is high and discharges usually forms streamers. Electrons 111 in streamer usually reach to the positive electrode in 100 nsec, while it takes milliseconds for positive ions 112 to reach negative electrode. Therefore, it is easier to collect positive ions 112 than electrons 111. Electrons 111 can be removed from the inner coating by placing a breakdown path to ground. A grounded metallic probe 114 can be placed near, not in contact to, the inner coating so that whenever coating reaches potential above the value without charges, air between coating and probe breakdown 115. This kind of setup will ensure to clean up any electron 111 deposits on the coating. Within 100 nsec, electrons 111 will be gone and positive charges 112 that are left can be blown away by the wind 113. Positive ions that are blown away from CDDBD system can be collected by an electrode 116 and be used as a current source or stored in an electricity storage system.

Figure 12:
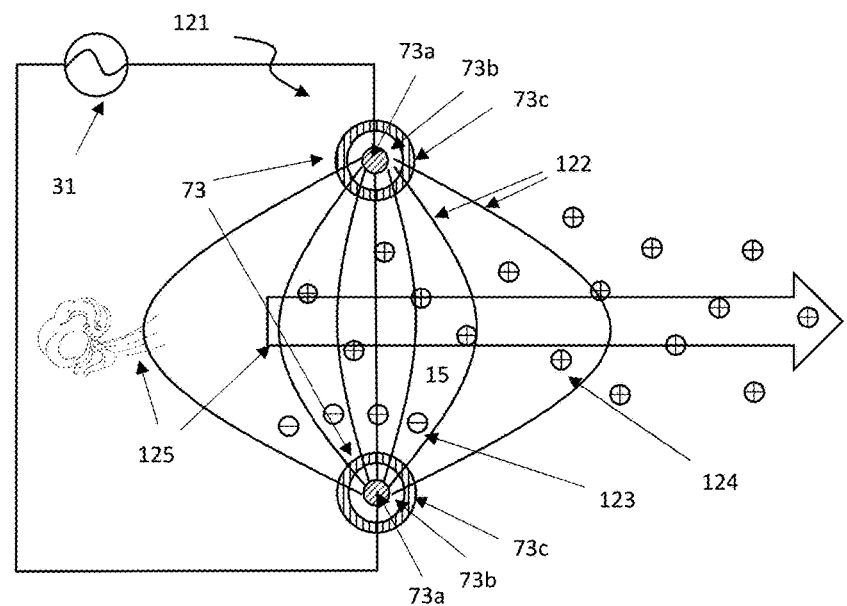
FIG. 12 illustrates one embodiment of a wind energy harvester using a wire CDDBD system described in FIGS. 7A & 7B.

Another embodiment of the present invention configured for wind energy harvesting using CDDBD system is shown in FIG. 12. Instead of channel of plasma area 15 formed by planar electrode assembly's 11 12 13, two wire electrode assembly's 73 geometry makes charges more accessible. Each wire electrode assembly 73 consists of core electrode 73*a*, insulator 73*b*, and coating 73*c* with high secondary electron emission material. Electrons 123 cross the plasma gas area 15 within 100's of nanoseconds and positive ions 124 are still within the plasma gas area 15 for about milliseconds. Positive ions 124 are more easily accessible for wind 125 to blow out.

Figure 13:
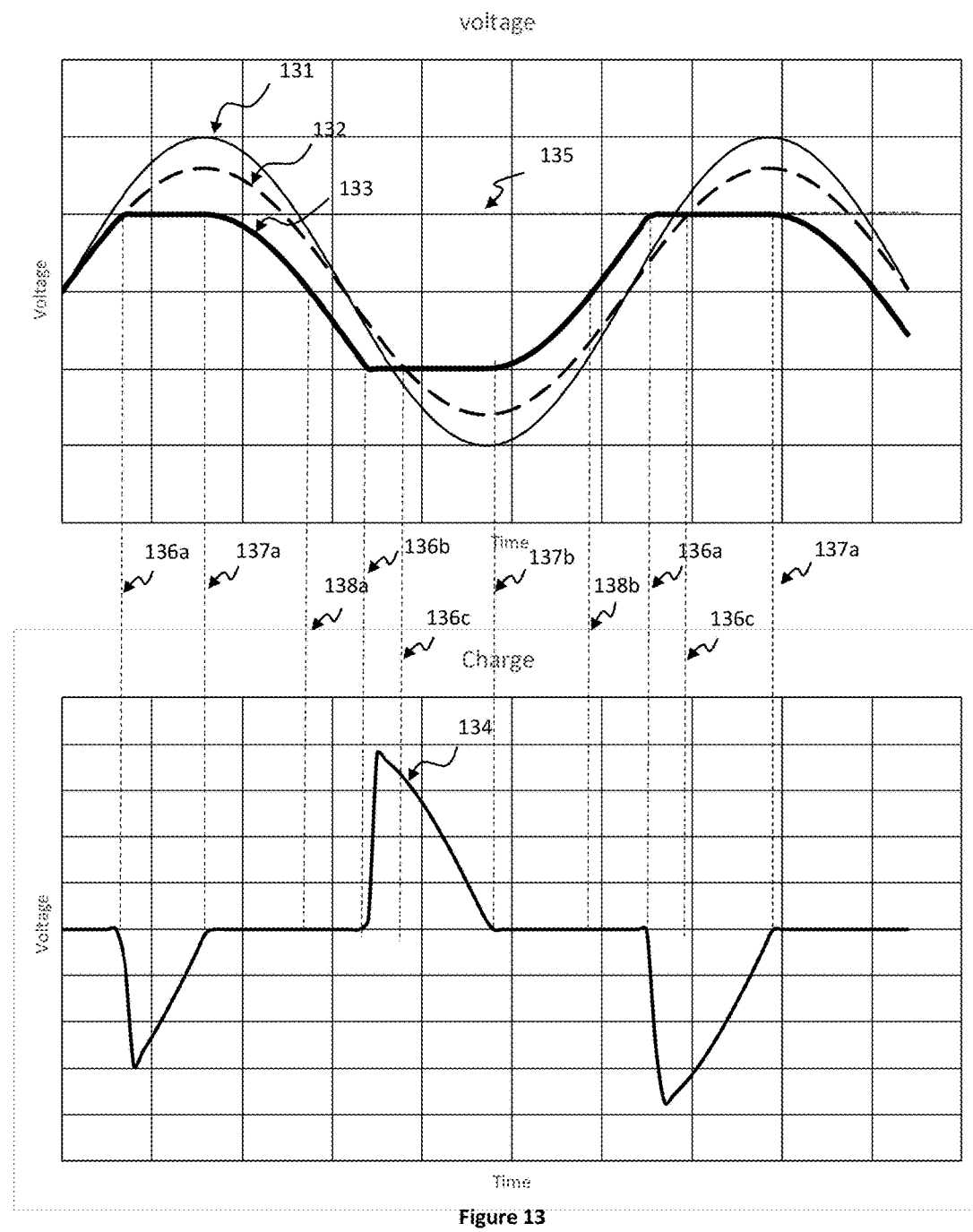
FIG. 13 illustrates voltage difference between electrodes, voltage difference between coatings if there was no Paschen discharge, voltage difference between coatings when there is Paschen discharge, and generated charges.

In this embodiment described in FIG. 12, AC power supply is connected to the center of the wire. Because polarity changes periodically, electrons deposited on the coating 73*c* of the wire is reset or removed every time polarity changes. Therefore, no path to ground is needed in the embodiment described in FIG. 12, in contrast to the embodiment described in FIG. 11, which utilized a DC power supply. With AC power supply, continuous charge generation and blow away of charges by wind is possible. At each half cycle, new charge generation is initiated. FIG. 13 describes voltage and charge generation step by step for each cycle. A curve 131 is a voltage difference between two core electrodes 73a, a curve 132 is a gap voltage between two outer coatings 73c at their nearest points if there was no Paschen discharge, and a curve 133 is an actual gap voltage between outer coatings 73c at their nearest points with Paschen discharge happened. The curve 133 is limited to Paschen threshold 135 of the present gas system 15, by Paschen breakdown. Paschen breakdown starts when the curve 132 is greater than Paschen breakdown threshold 135 at a time 136a. A curve 134 is the curve of charge generation that starts at the time 136a. It continues until the voltage 131 at the core electrode 73a stop increasing at a time 137a. At this point, a maximum number of positive ions 124 and electrons 123 are generated. Electrons 123 are most likely attached to one of the outer coatings 73c, but positive ions 124 are still floating in the air for a few milliseconds. At a time 138a, the gap voltage 133 is zero, and at this time, positive charges 124 are least bound to the CDDBD electric potential and is easily blown out of the system by wind. Having an AC power supply has an advantage of having continuation of the charge generation process as well as zero-crossing points when the positive ions are least bound to the CDDBD electric potential. The process continues with the core voltage 131 swinging to the other polarity. Because of the space charge electrons 123 and the positive charges 124 that were not cleared from the CDDBD system, Paschen breakdown occurs earlier at a time 136b than at a time 136c, where exact Paschen threshold occurs by external power supply. Charge generation continues in an opposite direction until time 137b when core voltage 131 doesn't increase any more. As the core voltage 131 swings back to original polarity, gap voltage 133 crosses another zero at time 138b, at which positive ions 124 are least bound to the electric potential of CDDBD system. And the process continuous on with the original polarity. Paschen breakdown occurs earlier than the very first cycle because of space charges from the previous half cycle.

The embodiment described in FIG. 12 with an AC power supply does not consume power other than unwanted power supply loss because none of the charges pass through the insulator 73b within the composite wire 73. Therefore, the embodiment described in FIG. 12 with AC power supply is a continuous current generator at the expense of wind energy. Therefore, the embodiment described in FIG. 12 is a wind energy harvester that converts wind energy into electrical energy. A continuous current source is possible with CDDBD system as described in embodiments in FIG. 6-10, where wind increases charge extraction efficiency.

Buried Electrode

Figure 14:
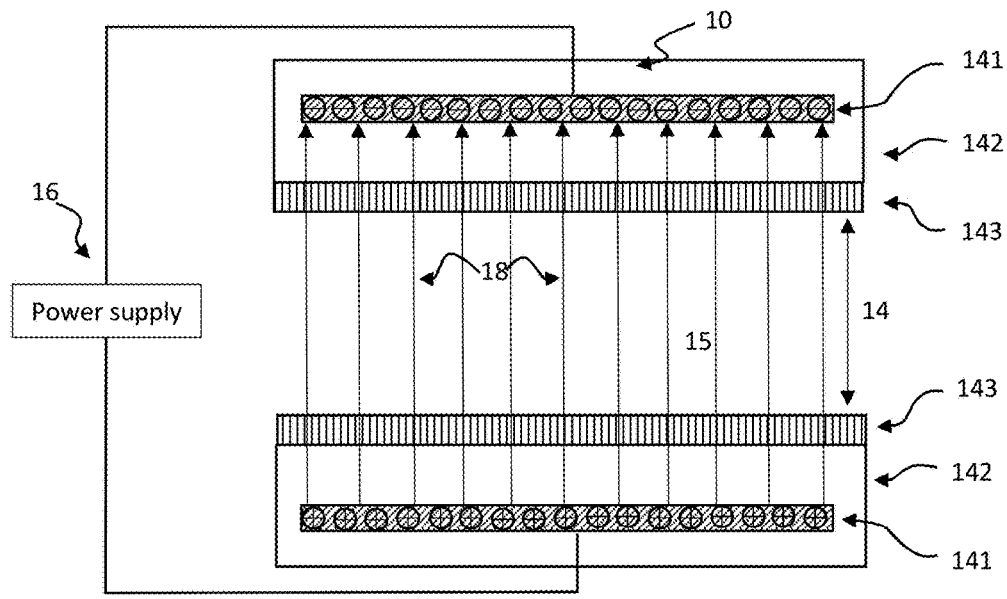
FIG. 14 illustrates one embodiment of CDDBD system with exemplary buried electrodes.

In all embodiments described in the present invention, electrodes that are exposed to a gas medium may need to be replaced with electrodes that are enclosed within insulator, so-called buried electrodes. An example of a buried electrode is described in FIG. 14. In a CDDBD system described in FIG. 1, electrodes 11 are exposed to the gas medium. Under high electric field, it is possible Paschen gas breakdown occurs between the electrode 11 and the coating 13 at the edge where both the electrode 11 and the coating 13 are exposed to the gas medium, which is counter to the purpose of insulator 12. This can occur especially when a large amount of charges are deposited on the coating 13. Then, the electric field between the coating 13 and the electrode 11 may exceed the Paschen threshold of the gas system, and unwanted shorting can occur between electrode 11 and coating 13 at the edge. In order to prevent this kind of unwanted scenario, electrode 141 is buried within the insulator 142 as shown in FIG. 14.

Fluorescent Light

Figure 15:
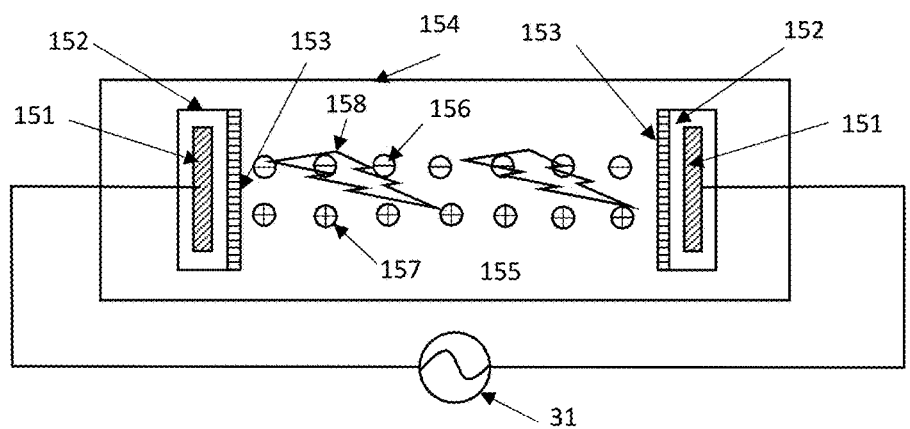
FIG. 15 illustrates one embodiment of energy efficient fluorescent lamps made of CDDBD system.

Another embodiment of the present invention is an energy efficient fluorescent lamp. CDDBD system described earlier enables a charge multiplication process through an impact ionization process. During the impact ionization process, photons are emitted. Photons are emitted because excited-state molecules are generated in the avalanche process, which then decay to the ground state by emitting photons. Photon energy which is only a portion of initial electric potential energy is obtained. Repeating of this process can be sustained if AC power is applied to the electrodes. A first embodiment of the energy efficient fluorescent lamp is described in FIG. 15. A CDDBD system is constructed within a glass tube 154 containing a gas system 155. The gas system 155 is a typical gas system used in the current fluorescent lamp such as low-pressure mercury vapor with argon, xenon, neon, and krypton. Inner surface of the glass tube 154 is coated with fluorescent materials for UV-to-visible conversion. Because electrodes 151 are covered with insulator 152, there is no charge exchange between discharge region 155 and the power supply system 31. The circuit is similar to a double capacitor system with the gas being a "resistor-like" element between two capacitors. So, if there is any power consumption, it will be from the "resistor-like" component. However, this "resistor-like" component is not a real resistor that has ohmic loss, because the discharge process is cold process, there is no joule heat dissipation. Photon emission also does not produce joule heat. Only power consumption is from unwanted resistive components within the power supply or power transformer.

Each electrode 151 consists of an electrode completely wrapped with insulating material 152. On top of each insulator, a coating 153 is applied with a material of high secondary emission coefficient, such as Ni, W, Mo, BeO, MgO, GaP, GaAsP, Si, PbO, as well as other materials with a high secondary emission coefficient. If high enough AC voltage is applied between two electrodes 151, the electric field gets high enough to have electrical breakdown of low pressure gas within the tube. Electrode 151 material buried inside the insulator can be a material with various conductivity including semiconductor. Semiconducting materials includes silicon, $Al_2O_3$:$TiO_{2-x}$ mixture, SiC, Germanium, gallium compound, polymer semiconductors, or polymer with ionic conductive agents. The conductivity of this material limits the gain in the impact ionization process, and therefore, controls the intensity of the streamer. Controlling of the gain can suppress arcing that can damage the electrodes. Impact ionization gain factor is also a function of the air gap and pressure, and therefore, conductivity of the electrode material can be varied according to the gap and gas pressure of the tube. Having semiconducting electrodes removes the need for ballast used in the current fluorescent lamps. The ballast in the current fluorescent lamps is needed to control current, without it, current is not controllable due to negative differential resistance of the lamp electric system. Semiconducting electrode controls and limits the current of discharge tube in a more fundamental level by controlling number of free charge, which can enhance electric field for streamer generation and form a positive feedback system electric field and charges at the electrode.

Absence of a ballast may require a shorter gap between electrodes than conventional fluorescent lamps for reasonable impact ionization gain control. Typically, uniform discharge is possible if the gap is less than 100 um at one atmosphere. Typical pressure at fluorescent lamp tube is 0.3% of atmosphere. So, this may convert into maximum gap of 30 cm. For a given limitation of the gap between electrodes, wide area electrodes may be needed for reasonable light emission.

Figure 16:
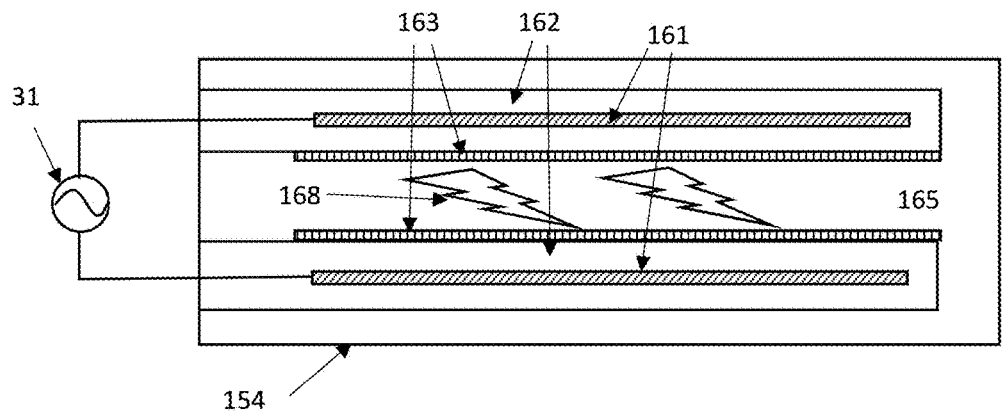
FIG. 16 illustrates another embodiment of energy efficient large-area fluorescent lamps made of CDDBD system.

Broad-area lamps are useful in order to protect eyes from an intense light emission as a result of concentrated, point source lighting systems, such as light bulbs or LEDs. In an embodiment of the present invention, a wide area energy-efficient fluorescent lamp is described in FIG. 16. The drawings in the FIG. 16 is a side view of the wide-area energy efficient fluorescent lamp. Electrode assembly is made of sheets of electrodes 161, sheets of insulators 162, and sheets of coating 163. In this case, both electrodes 161, insulator 162, and secondary emission coating 163 can be made of UV transparent materials. For example, electrode 161 can be made of transparent conducting oxide, such as Indium tin oxide (ITO) or aluminum-doped zinc-oxide (AZO). Insulator 162 can be made of polyimide, PET, glass, or quartz. Secondary emission coating layer can be MgO, or GaP, for example.

Figure 17:
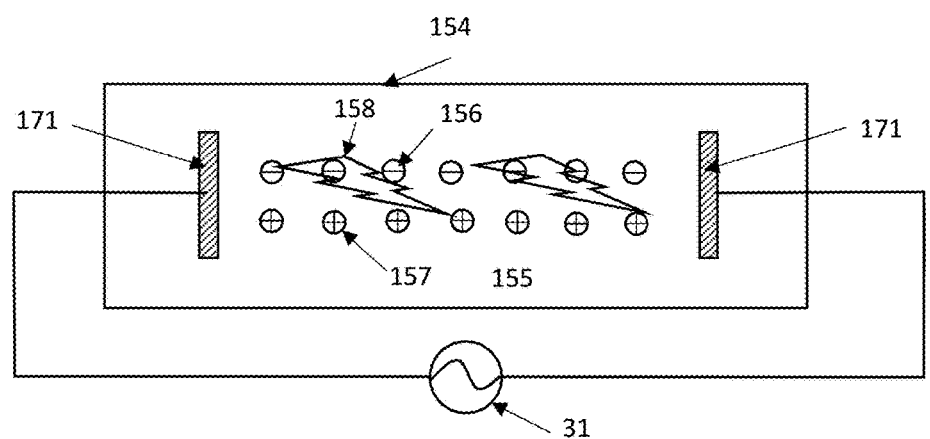
FIG. 17 illustrates one embodiment of ballast-free fluorescent lamps made of semiconducting electrodes.

Another embodiment of the present invention enables a fluorescent lamp that is ballast-free. An embodiment of the ballast-free fluorescent lamp is described in FIG. 17. The ballast-free fluorescent lamp is similar to a conventional fluorescent lamp, but electrode 171 is made of electrically resistive material or semiconductor materials instead of metal. For a given discharge gap, gas, pressure, and voltage, a right conductivity or resistivity of the electrode 171 material can be chosen to suppress too strong streamers or discharge current. This removes one of the expensive component of present fluorescent lamp. Materials for electrode 171 can be silicon, $Al_2O_3$:$TiO_2$, mixture, SiC, Germanium, gallium compound, polymer semiconductors, or polymer with ionic conductive agents, where its conductivity can be tuned to give the best results.

Ozone Generator

Figure 18:
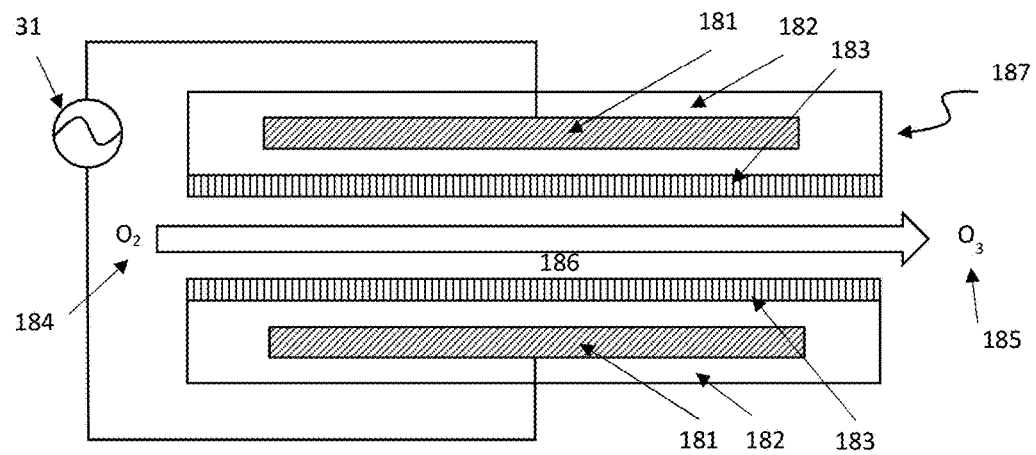
FIG. 18 illustrates one embodiment of energy efficient ozone generators made of CDDBD system.

Another embodiment of the present invention is an energy efficient ozone generator that is absent of arcing that can damage electric discharge system. Oxygen ($O_2$) is introduced into a coated double dielectric barrier discharge (CDDBD) system and converts into ozone ($O_3$) through plasma within CDDBD. An embodiment of the energy efficient ozone generator using CDDBD system is shown in FIG. 18. Each electrode 181 consists of an electrode completely wrapped with insulating material 182. On top of each insulator, a coating 183 is applied with a material having a high secondary emission coefficient, such as Ni, W, Mo, BeO, MgO, GaP, GaAsP, Si, PbO, alkali antimonide, as well as other materials with a high secondary emission coefficient. If a high enough AC voltage 31 is applied between two electrodes 181, the electric field gets high enough in the air, air start to breakdown, at ~3-10V/um. Many different gas molecules will be generated including $O_3$, NO, $NO_2$, NO $(H_2O)_n$, $NO_2(H_2O)_n$, etc. If there is only oxygen 184, by forcing oxygen 184 flow from an oxygen tank (not shown), only ozone 185 will be generated. Because there is an insulator 182, no charges pass through from power supply to the gas region 186, i.e., the CDDBD system is a capacitive load. Therefore, there is no power consumption other than unwanted power loss in the power supply 31. CDDBD system 187 also can be seen as two capacitance systems with air being conductive. However, air conduction is a cold process (impact ionization or cold plasma), there is no heat dissipation. Therefore, overall CDDBD system 187 has no power consumption other than any other unwanted heat dissipation by a resistor in the power supply circuit. With a minimum power consumption design of the power supply (for example, direct step-up transformer from the power line), power consumption can be minimized to be only at the power transformer. Such system is an energy efficient ozone generator.

Electrode material 181 buried inside the insulator 182 can be a material with various conductivity including semiconductor. Semiconducting materials includes silicon, $Al_2O_3$: $TiO_{2-x}$ mixture, SiC, Germanium, gallium compound, polymer semiconductors, or polymer with ionic conductive agents. The conductivity of this material limits the gain in the impact ionization process, and therefore, controls the gain of the streamer. Controlling of the gain can suppress arcing that can damage the CDDBD system. Impact ionization gain is also a function of the air gap, and therefore, conductivity of the electrode material can be varied according to the gap so that highly efficient ozone generation is achieved, but without arcing.

Figure 19:
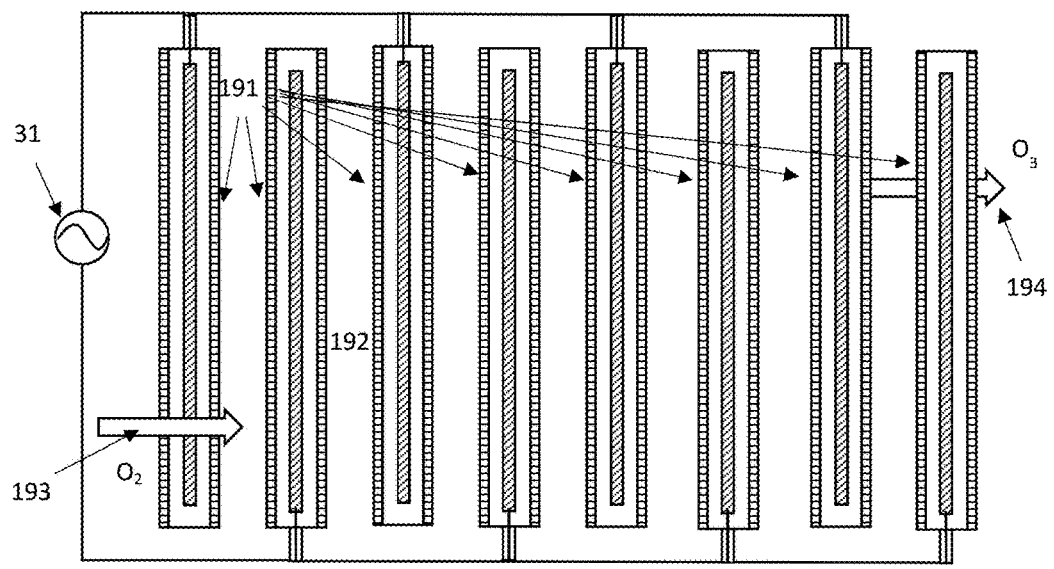
FIG. 19 illustrates another embodiment of tandem energy efficient ozone generators made of CDDBD system.

Another embodiment of the energy-efficient ozone generator is shown in FIG. 19. This embodiment is an extension of the embodiment in FIG. 18 in tandem, comprising an array of planar electrode assembly 191 that is made of core electrode, insulator, and coating with air gaps 192 between electrode assemblies 191. Each electrode 191 is connected to the power supply with alternating polarity so that each gas gap 192 has electric field from applied voltages and therefore Paschen discharge. Oxygen 193 is feed into the side of the array of sheets of electrode assembly 191 and ozone 194 comes out at the other end.

It is to be understood that the above description is intended to be illustrative, and not restrictive. Many other embodiments will be apparent to those of skill in the art upon reading and understanding the above description. It will be appreciated by those of ordinary skill in the art that any of the embodiments discussed above may be used for various purposes according to the particular implementations, design considerations, goals, etc. The scope should, therefore, be determined with reference to the appended claims, along with the full scope of equivalents to which such claims are entitled.

The foregoing description, for purpose of explanation, has been described with reference to specific embodiments. However, the illustrative discussions above are not intended to be exhaustive or to limit the described embodiments to the precise forms disclosed. Many modifications and variations are possible in view of the above teachings. The embodiments were chosen and described in order to best explain the principles and practical applications of the various embodiments, to thereby enable others skilled in the art to best utilize the various embodiments with various modifications as may be suited to the particular use contemplated.

What is claimed is:

1. A system for the generation and use of plasma, the system comprising:
    a coated double dielectric barrier discharge (CDDBD) device that generates electric charges when cosmic rays pass through the CDDBD device,
    a power supply coupled with the CDDBD device that supplies energy to the CDDBD device to form an initial electric field, and
    wherein the CDDBD device comprises at least two electrodes that are separated by a gap filled with a gas medium, wherein each of the at least two electrodes are covered with an insulator that prevents electric charges in the at least two electrodes from passing through the gas medium, and wherein a surface of the insulators is coated with a material having a secondary electron emission coefficient higher than a material of the insulator, and wherein the electric charges that are generated when the cosmic rays pass through the CDDBD device are multiplied within the gap of the CDDBD device by impact ionization of gas molecules in the gas medium without using the energy supplied by the power supply other than initial electric field energy.

2. The system of claim 1, wherein the CDDBD device comprises a hollow tube made of electrically insulating material, wherein the hollow tube has openings at distal ends of the hollow tube, wherein an internal space of the hollow tube is filled with the gas medium, wherein the hollow tube comprises the at least two electrodes coated on an outside of the hollow tube with a separation in an axial direction along the hollow tube creating an electric field within the hollow tube, and wherein an internal surface of the hollow tube is coated with the material having the secondary electron emission coefficient higher than the material of the insulator.

3. The system of claim 2, wherein the electrically insulating material has an electrical resistivity higher than $10^{17}$ Ω·cm and a dielectric strength higher than 15 MV/m.

4. The system of claim 2, wherein the electrically insulating material is one of quartz, porcelain, glass, polyimide, Teflon, or Polyethylene terephthalate (PET).

5. The system of claim 2, further comprising:
the power supply comprising an alternating current (AC) power supply that regulates a voltage supplied to the at least two electrodes of the hollow tube, wherein the supplied voltage is higher than a Paschen breakdown voltage; and
the hollow tube forms a jet of plasma where electric charges generated within the hollow tube are expelled from the hollow tube and form a jet of electric charge,
wherein plasma is generated by ionization of gas molecules within the hollow tube when cosmic rays pass through the hollow tube, and electric charges are multiplied by an impact ionization process when the voltage supplied by the power supply is higher than the Paschen breakdown voltage creating an electrical field in the axial direction of the hollow tube, and
and the hollow tub is a capacitive system and the AC power supply does not transfer energy to the hollow tube for forming the jet of plasma.

6. The system of claim 5, wherein the hollow tube is oriented so that wind is directed through the hollow tube, wherein air molecule in the wind that pass through the hollow tube transfer kinetic energy to charged molecules or electrons formed in the plasma generated within the hollow tube, and wherein the transfer of the kinetic energy from the wind to the charged molecules or electrons causes the electric charge to be expelled from the hollow tube.

7. The system of claim 5, further comprising:
a third downstream electrode coated on the outside of the hollow tube between an end of the hollow tub where electric charge is being expelled and one of the two or more electrodes, wherein the third electrode is biased at a constant different potential relative to one of the two or more electrodes that is nearest the third downstream electrode, wherein an electric field between the third electrode and the one of the two or more electrodes apply Coulomb forces on electric charges within the jet in the axial direction to enhances electric charge output from the hollow tube.

8. The system of claim 1, wherein the at least two electrodes are metal electrodes.

9. The system of claim 1, wherein the at least two electrodes are semiconductor electrodes.

10. The system of claim 5, further comprising:
a power storage device; and
a metal plate or metal mesh, electrically coupled with the power storage device, that captures the jet of electric charge expelled from the hollow tub and supplies electric charge from the captured electric charge to the power storage device.

11. The system of claim 5, further comprising:
an electrically powered device; and
a metal plate or metal mesh, electrically coupled with the electrically powered device, that captures the jet of electric charge expelled from the hollow tub and supplies electric charge from the captured electric charge to power the electrically powered device.

12. The system of claim 1, wherein the gas medium comprises oxygen and nitrogen in one atmospheric pressure.

13. The system of claim 1, wherein the CDDBD device is an enclosed system, and wherein the gas medium comprises helium or argon at a pressure ranging from 1% of an atmospheric pressure to one atmospheric pressure.

14. The system of claim 1, wherein the material that coats the insulating material with the secondary electron emission coefficient higher than the insulator is one of Ni, W, Mo, BeO, MgO, GaP, GaAsP, Si, PbO, or alkali antimonide.

* * * * *